United States Patent [19]
Watts, Jr. et al.

[11] Patent Number: 5,868,305
[45] Date of Patent: Feb. 9, 1999

[54] JET SOLDERING SYSTEM AND METHOD

[75] Inventors: Hal G. Watts, Jr., Holden; Robert J. Balog, North Attleboro; Gary T. Freeman, Beverly, all of Mass.

[73] Assignee: MPM Corporation, Franklin, Mass.

[21] Appl. No.: 935,525

[22] Filed: Sep. 22, 1997

Related U.S. Application Data

[63] Continuation of Ser. No. 533,515, Sep. 25, 1995, abandoned.

[51] Int. Cl.$^6$ ....................................................... B23K 3/06
[52] U.S. Cl. ............................................ 228/254; 266/237
[58] Field of Search .............................. 228/180.22, 254; 266/237, 239

[56] References Cited

U.S. PATENT DOCUMENTS

| | | |
|---|---|---|
| 3,222,776 | 12/1965 | Kawecki . |
| 3,570,721 | 3/1971 | Cushman . |
| 3,588,906 | 6/1971 | Brimer . |
| 3,826,224 | 7/1974 | Baker . |
| 3,916,042 | 10/1975 | Grietens . |
| 4,075,636 | 2/1978 | Galetto . |
| 4,126,711 | 11/1978 | Marlow . |
| 4,303,108 | 12/1981 | Alcers . |
| 4,347,521 | 8/1982 | Teumer . |
| 4,530,464 | 7/1985 | Yamamoto . |
| 4,551,731 | 11/1985 | Lewis . |
| 4,575,730 | 3/1986 | Logan . |
| 4,597,420 | 7/1986 | Schoenthaler . |
| 4,828,886 | 5/1989 | Hieber . |
| 5,024,255 | 6/1991 | Watanabe . |
| 5,193,738 | 3/1993 | Hayes ................................ 228/180.22 |
| 5,229,016 | 7/1993 | Hayes . |
| 5,320,250 | 6/1994 | La . |
| 5,377,902 | 1/1995 | Hayes ...................................... 228/254 |
| 5,377,961 | 1/1995 | Smith et al. ............................. 266/237 |
| 5,506,385 | 4/1996 | Murakami . |
| 5,507,327 | 4/1996 | Ziegler . |

FOREIGN PATENT DOCUMENTS

| | | |
|---|---|---|
| 63004657 | 1/1988 | Japan . |
| WO 96/09121 | 3/1996 | WIPO . |

OTHER PUBLICATIONS

Orme, "Precision Droplet Streamline Manufacturing", Proceedings of the International Conference On Advanced Synthesis of Engineered Structural Materials, 31 Aug.–2 Sep. 1992, San Francisco, CA pp. 237–244.

Orme, "Rapid Solidification Materials Synthesis With Nano–Liter Droplets", SAE Technical Paper Series, Aerotech '93, Costa Mesa, CA, Sep. 27–30, 1993, pp. 113–118.

Orme, "A Novel Technique of Rapid Solidification Net–Form Materials Synthesis", Journal of Materials Engineering and Performance, vol. 2, No. 3, Jun. 1993, pp. 399–405.

Wallace, "Automated Electronic Circuit Manufactuirng Using Ink–Jet Technology", Transactions of the ASME, vol. 111, pp. 108–111, Jun., 1989.

(List continued on next page.)

*Primary Examiner*—Kenneth J. Ramsey
*Attorney, Agent, or Firm*—Mintz, Levin, Cohn, Ferris, Glovsky and Popeo, P.C.

[57] ABSTRACT

An apparatus for depositing a selected pattern of solder onto a substrate comprising a substrate support, a solder ejector, and a gas-delivery system associated with the solder ejector. The substrate support has structure for bearing a substrate on which one or more electronic components are to be mounted. The solder ejector has a housing that defines an orifice for producing a stream of molten solder droplets along a selected trajectory relative to the substrate support to deposit molten solder onto the substrate in a selected pattern. The gas delivery system has an input for receiving pressurized inert gas and an output aligned with the directed stream of molten droplets for discharging from the orifice of the solder ejector a flow of inert gas aligned with the ejected molten solder droplets. A method for depositing a selected pattern of solder onto a substrate is also described.

11 Claims, 12 Drawing Sheets

OTHER PUBLICATIONS

Hayes et al., "Application of Ink Jet Technology to Microelectronic Packaging", ISHM '89 Proceedings Proceedings, Maryland, pp. 627–634.

Priest et al., Liquid Metal_Jetting Technology: Application Issues For Hybrid Technology, The International Journal of Microcircuits and Electornic Packaging, vol. 17, No. 3, Third Quarter 1994, pp. 219–227.

Priest et al., "Liquid Metal–Jetting: Its Application To SMT", Journal of SMT, Oct. 1993, pp. 4–10.

U.S. application No. 08/533,508.
U.S. application No. 08/724,034.
U.S. application No. 08/533,511.
U.S. application No. 08/533,509.
U.S. application No. 08/803,758.
U.S. application No. 08/718,605.
U.S. application No. 08/533,510.
Declaration of Hal G. Watts, Jr.

JET SOLDERING SYSTEM AND METHOD

This application is a continuation of application Ser. No. 08/533,515, filed on Sep. 25, 1995 now abandoned.

BACKGROUND

This invention relates to a jet soldering system and method.

Various soldering schemes have been developed for bonding semiconductor integrated circuit (IC) chips to a substrate (e.g., a printed circuit board). In some schemes, a semiconductor IC chip is bonded to a substrate by applying a small solder bump to the bottom surface of the chip, aligning the solder bump with a bond pad on the surface of the substrate, and heating the solder bump until it reflows. In some other schemes, solder bumps are applied to bonding pads on a substrate; afterwards, electronic components are bonded to the substrate by positioning the components over the solder bumps and by heating and reflowing the solder bumps. Some schemes bond IC chips to a patterned layer of solder created by applying a thin layer of solder paste to a substrate through holes in a stencil, leaving a selected solder pattern on the substrate. Recently, solder jet systems have been proposed for depositing solder droplets onto a substrate in a selected pattern. Such systems include a solder droplet ejector, which may eject solder droplets on-demand or continuously. In one proposed continuous solder jet system, a droplet generator vibrates to form a stream of solder droplets; an electrical charge is applied to the droplets and the charged droplets are passed between charged deflection plates which selectively direct the droplets to a target surface or to a catcher system.

SUMMARY OF THE INVENTION

In one aspect, the invention features an apparatus that deposits a selected pattern of solder onto a substrate and includes a substrate support, a solder ejector, and a gas-delivery system associated with the solder ejector. The substrate support has structure for bearing a substrate on which one or more electronic components are to be mounted. The solder ejector produces a stream of molten solder droplets along a selected trajectory relative to the substrate support to deposit molten solder onto the substrate in a selected pattern. The gas delivery system has an inlet for receiving pressurized inert gas and an outlet that causes a stream of the inert gas to surround the stream of molten droplets and travel toward the substrate support with the droplets.

Embodiments may include one or more of the following features. The gas delivery system preferably includes a gas diffuser, which is preferably formed from sintered material (e.g., ceramic or metal). The gas delivery system preferably includes a cylindrical member that defines a gas flow passage for producing a flow of gas that surrounds ejected droplets. The cylindrical member is an electrically conductive element for applying a charge to the solder drops, and a pair of deflection elements is preferably positioned downstream of the cylindrical charging member for defining an electrical field therebetween for selectively deflecting the charged solder droplets. Solder is preferably supplied to the solder ejector by a replaceable solder cartridge which is detachably coupled to a housing of the solder ejector. The gas delivery system is preferably selectively detachable the replaceable solder cartridge. A vibrator is preferably coupled to the solder ejector to produce a continuous stream of molten solder droplets.

Embodiments of the invention may include one or more of the following advantages. The gas delivery system delivers a supply of inert gas around the stream of ejected droplets, substantially preventing oxidation of the solder droplets, which would otherwise affect the uniformity and quality of the deposited droplets. This allows the solder jetting system to be operated outside of a vacuum environment, greatly enhancing the flexibility of the system and its use in a production environment to automatically deposit solder on circuit boards.

Other features and advantages will become apparent from the following description and from the claims.

DESCRIPTION OF THE PREFERRED EMBODIMENTS

Figure 1:
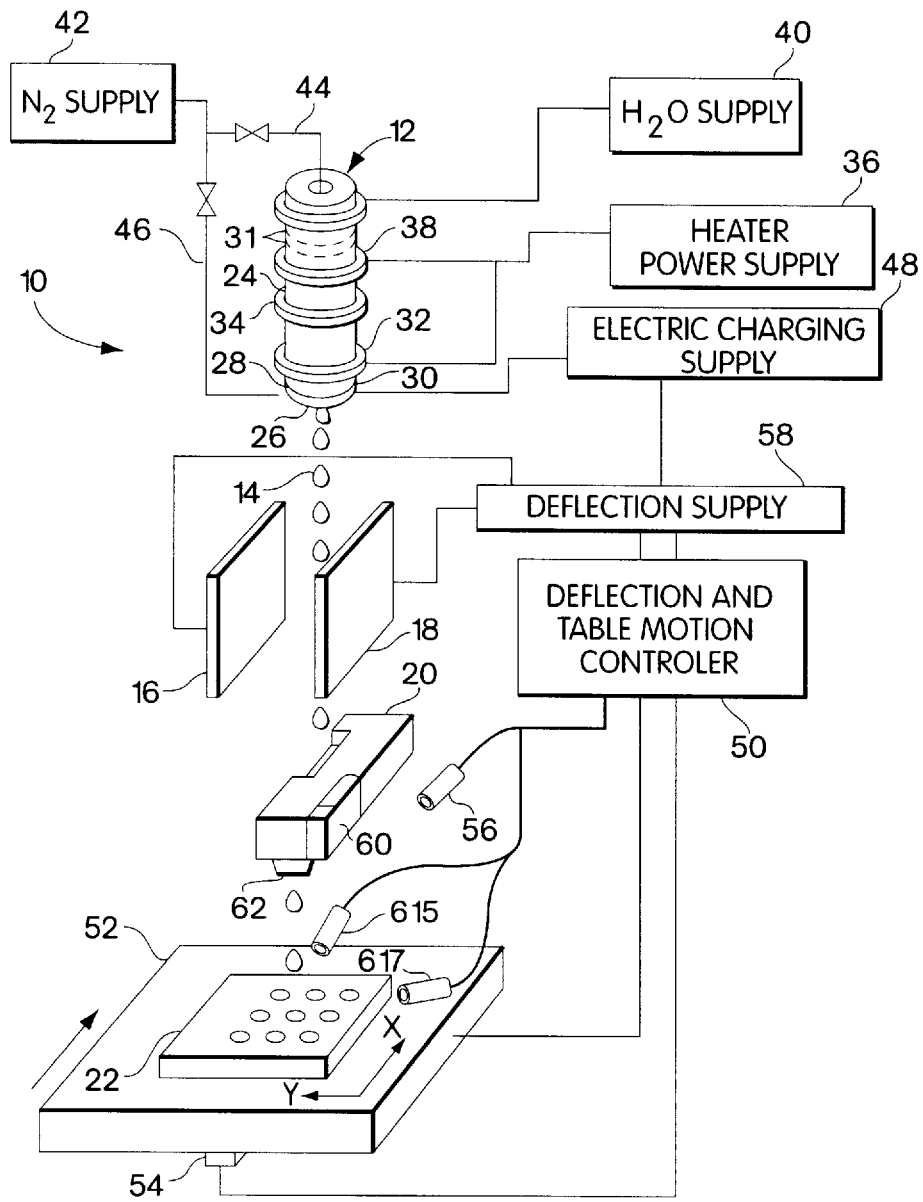
FIG. 1 is a diagrammatic perspective view of a jet soldering system for depositing solder droplets onto a substrate.

Referring to FIG. 1, a jet soldering system 10 includes a solder ejector 12 for providing a continuous stream of charged solder droplets 14, deflection plates 16, 18 for passing the charged solder droplets through to a gutter 20 or deflecting the droplets toward a substrate 22, on which one or more semiconductor IC chips are to be mounted. Solder ejector 12 includes a cylindrical slotted housing 24 that has an interior for receiving a replaceable solder cartridge. A detachable end assembly 26 attaches to housing 24 by snap tabs 28, 30; the end assembly is detached from housing 24 for loading (and unloading) replaceable solder cartridges into the housing. An electro-mechanical vibrator 31 (a piezoelectric crystal vibrator; shown in shadow) is disposed within ejector 12 and is coupled to a vibrator power supply which delivers an alternating electrical signal to the vibrator for producing a standing wave in the stream of solder leaving the ejector. Heaters 32, 34 are clamped onto the outer wall of housing 24 at spaced-apart locations. The heaters are coupled to a heater power supply 36, which supplies sufficient power to melt solder contained within the replaceable solder cartridge retained inside the housing. A cooling ring 38 is attached to the cylindrical housing at a location between the heaters and the electro-mechanical vibrator to maintain the temperature of the vibrator close to room temperature. The cooling ring is fluidly coupled to a circulating water supply 40 that circulates room temperature water through the cooling ring. A supply 42 delivers nitrogen gas (or other inert gas such as argon) along a gas line 44 to pressurize the cartridge to control the formation of solder droplets leaving the ejector. Nitrogen (or or other inert gas such as argon) is also supplied through a gas line 46 to detachable end assembly 26 to further control solder droplets 14, as described in detail below. The inert gas is high purity gas such as research grade or better. A droplet charging supply 48 is coupled to the end assembly 26 so that a charge may be selectively applied to the solder droplets on a droplet-by-droplet basis.

Solder droplets 14, formed by ejector 12, are directed to pass between deflection plates 16, 18, which are controllably charged by a deflection and table motion controller 50. Controller 50 controls the bias applied to deflection plates 16, 18 by a deflection power supply 58. Controller 50 is coupled to a linear x-y translation table 52, on which substrate 22 is mounted. A linear encoder 54 provides signals to the controller for precisely coordinating the position of the translation table. A camera 56 images the substrate on the x-y table so that the controller can coordinate the position of the substrate on the x-y table with the position indicated by the linear encoder. The charge on each droplet controls whether the solder droplet 14 is passed undeflected to the gutter or deflected toward the substrate along the Y axis while the table is moved along the X axis. The magnitude of the charge determines the extent of deflection along the Y axis. The gutter includes a removable receptacle 60 for collecting solder caught by the gutter. A heater 62 heats the solder caught by the receptacle so that the solder remains in liquid form until it flows into the receptacle. The receptacle is removed periodically so that caught solder may be recycled.

Figure 2:
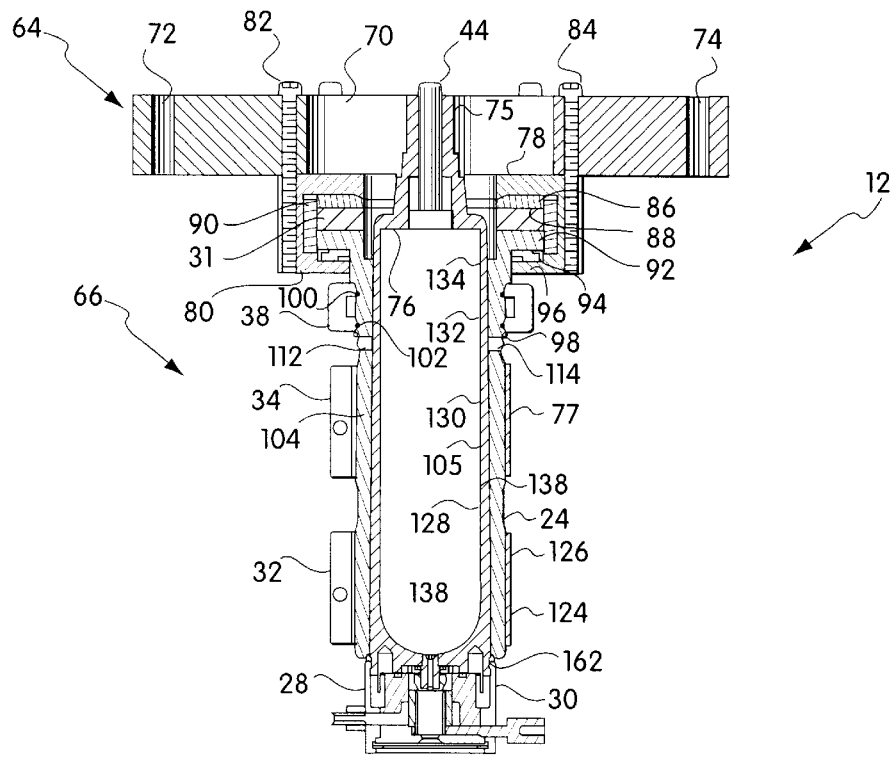
FIG. 2 is a cross-sectional side view of a solder ejector, including a detachable end assembly.
Figure 2A:
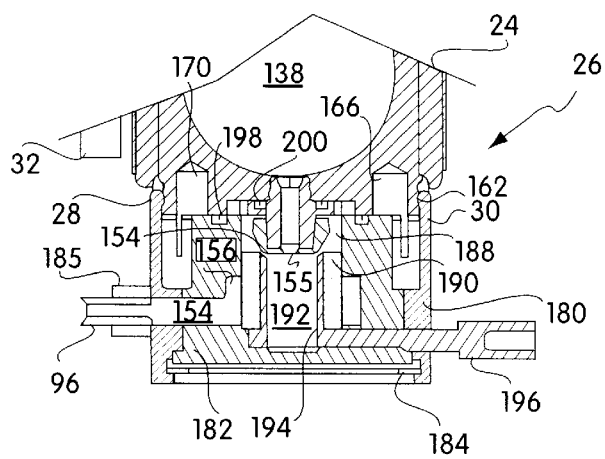
FIG. 2A is an enlarged view of the bottom of the solder ejector of FIG. 2.
Figure 3:
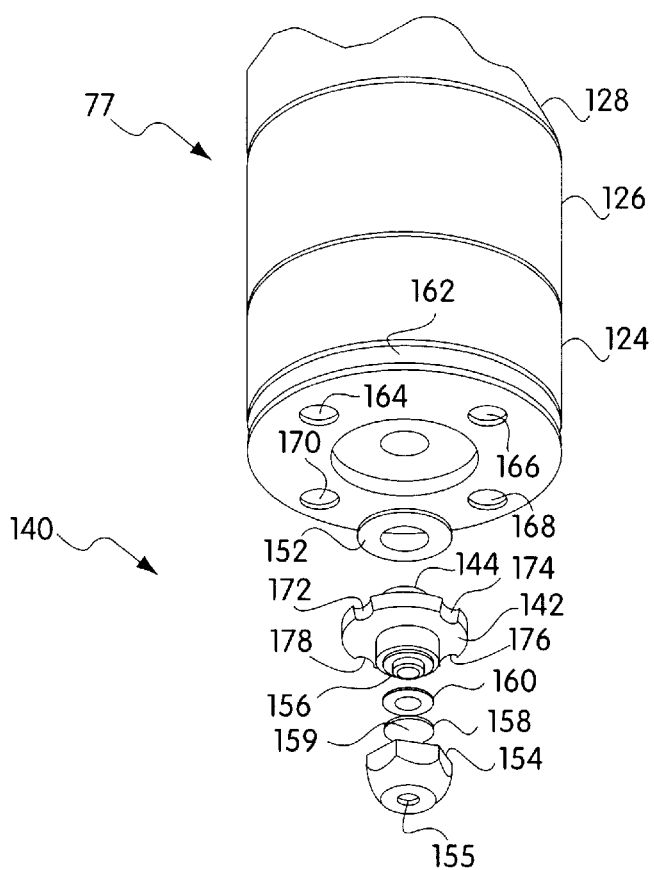
FIG. 3 is a diagrammatic exploded view of the bottom end of the solder ejector shown in FIG. 2, without the detachable end assembly.
Figure 4:
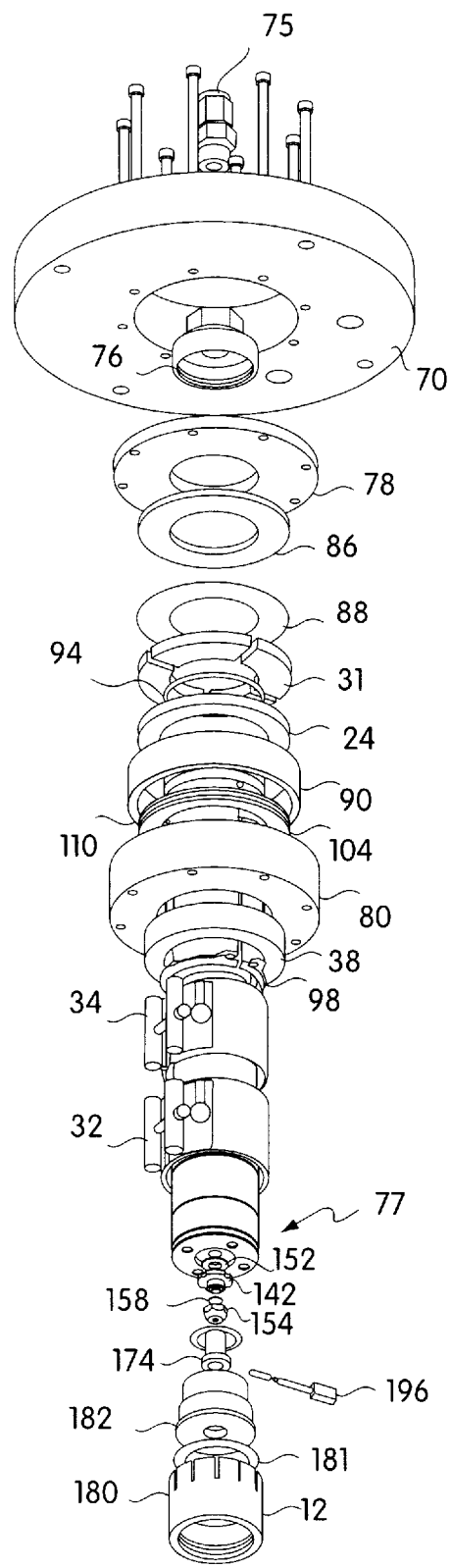
FIG. 4 is a diagrammatic exploded view of the solder ejector shown in FIG. 2.

Referring generally to FIGS. 2–4, and in particular to FIGS. 2 and 2A, solder ejector 12 has an upper stationary section 64 and a lower vibrating section 66. Stationary section 64 includes a top mounting flange 70 that has through holes 72, 74 for mounting the ejector to a support structure. A gas fitting 75 is coupled to a threaded housing cap 76; the fitting and the housing cap are used to supply nitrogen (or other inert gas such as argon) gas from gas line 44 to the interior of the ejector for pressurizing solder contained within a replaceable solder cartridge 77. A top cover 78 is fixedly coupled between the mounting flange and a piezoelectric seat 80 which attaches to the mounting flange by screws 82, 84. An electrically insulating ceramic disk 86 provides electrical insulation between the top cover and a copper washer 88, which serves as an active electrode for piezoelectric vibrator 31. The copper washer is electrically connected to a vibrator power supply, and the housing is electrically grounded. A teflon bearing ring 90 is positioned inside the piezoelectric seat between the inner wall of the seat and an outer circular edge 92 of the top of vibrating section 66.

Vibrating section 66 sits on top of several Belleville springs 94, which are supported by an inner annular lip 96 of the piezoelectric seat. Heaters 32, 34 clamp around housing 24, and cooling ring 38 is supported above the heaters by a snap ring 98. Silicon o-rings 100, 102 fluidly seal the cooling ring against the housing. Housing 24 includes four longitudinal slots 104–110 that extend from respective key-holes 112–118 to the bottom edge 120 of the housing (see FIG. 4). The slots reduce outward radial expansion of the housing during heating so that good thermal contact is maintained between the housing and the solder cartridge.

Replaceable solder cartridge 77 has a top end 134, which has a smooth outer surface which seals with an o-ring contained within housing cap 76. Cartridge 77 has outer threads 132 that mate with the inner threads of housing 24. The solder cartridge has an outer wall surface that tapers in outer diameter from a bottom diameter to a smaller top diameter at top end 122. The outer wall surface is tapered in outer diameter by forming a series of four cylindrical stepped regions 124–134 (a smaller or larger number can be used), with progressively smaller outer diameters, in the outer wall of the cartridge housing; in this way, the wall thickness of the cartridge housing is smaller at the top end than it is at the bottom end. The inner wall surface of the solder ejector has a correspondingly-stepped inner surface for receiving the solder cartridge. The inner wall surface of solder cartridge 77 defines a inner cylindrical bore 136 with a hemispherically shaped bottom 138 for containing solder. The inner wall surface of the solder ejector is sized to form an interference fit when the solder cartridge is screwed into the housing 24 of the solder ejector. The solder cartridge is preferably formed of material that has a relatively high thermal conductivity to reduce the time needed to heat solder to the desired temperature. The solder cartridge is held firmly in position so that frequency-shifted structural vibrations are suppressed; i.e., only those vibrations superimposed on the cartridge holder by the piezoelectric vibrator are preferably permitted.

Figure 3A:
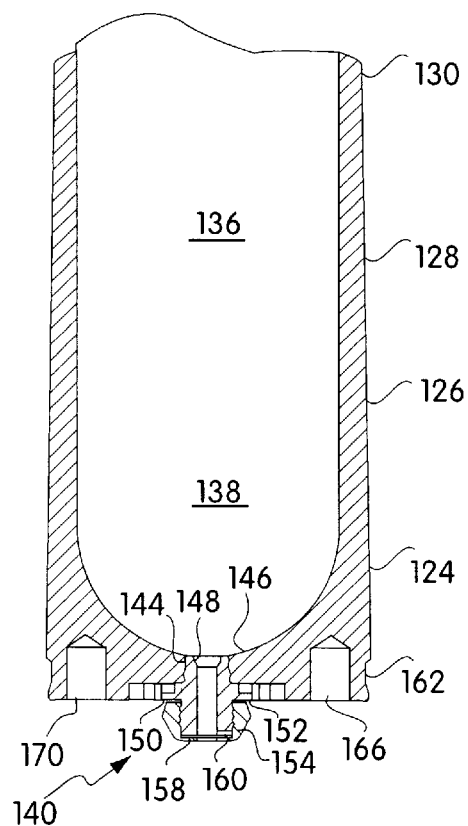
FIG. 3A is a diagrammatic cross-sectional side view of the bottom end of the solder ejector shown in FIG. 2, without the detachable end assembly.

As shown in FIGS. 3 and 3A, a nozzle 140 is coupled to the bottom end of the replaceable solder cartridge. Nozzle 140 includes a base 142 with a threaded end 144 that defines cylindrical bore 146 with a conically-shaped input surface 148, which reduces flow disturbances for solder flowing between the solder cartridge and the nozzle. Base 142 includes an annular groove 150 for receiving an o-ring 152; the groove is sized so that the outer thickness of the o-ring is slightly larger than the depth of the groove. A nozzle cap 154 has a solder-ejecting orifice 155 and further has inner threads that engage threads within the bottom end of base 142. The base includes a cylindrical protrusion 156 onto which sits a replaceable flat disk 158 that defines a liquid solder-ejecting orifice 159. A sealing o-ring 160 is disposed between disk 158 and base 142. Orifice 159 is cylindrical, i.e., has the same diameter over its length from one side of the disk to the other. The dimension (L) of the orifice 159

(here the thickness of the disk) is sized relative to diameter (D). L/D preferably is at most 1.0, and more preferably is at most 0.25.

The bottom end of the replaceable solder cartridge includes a circumferential groove 162 which receives snap tabs 28, 30 that secure end assembly 26 to the replaceable cartridge. The bottom end of the solder cartridge also includes four symmetrically spaced-apart recesses 164–170 which are sized to receive a four-pronged tool for screwing the solder cartridge into and out of the ejector housing. The base of nozzle 140 has four slots 172–178 that mate with a tool used to fasten the nozzle assembly into the solder cartridge.

Referring back to FIGS. 2 and 2A, detachable end assembly 26 includes an outer cylindrical housing 180 surrounding an inner electrical insulator 182, which is held in place by a retaining ring 184. An adaptor 185 couples gas line 46 to a throughway 186, defined through the outer housing and the insulator. In operation, nitrogen (or other inert gas such as argon) gas flows through the throughway and into an annular cavity 188; the gas proceeds through a sintered ceramic diffuser 190, past a cavity which surrounds nozzle 140, and through a cylindrical bore 192 defined within a cylindrical charging tube 194. charging tube 194 connects to droplet charging supply 48 (FIG. 1) by a charge conductor 196. The end assembly is fluidly sealed to the replaceable solder cartridge by high-temperature o-ring seal 198. For proper operation, it is important that liquid solder not be exposed to oxygen in the ambient air.

The electrically conducting components of the ejector, including the ejector housing, are made of 316 stainless steel. The replaceable solder cartridges are also made of 316 stainless steel. The o-rings are high-temperature silicon o-rings. The electrodes (electrode 88 and charging tube 194) are made of 316 stainless steel. For depositing 63/37 (tin/lead) solder, the band heaters each supply 200 W of power for heating the solder contained in cartridge 77 to about 390°–500° F., and the nitrogen (or other inert gas such as argon) gas supplied the droplet forming assembly is heated to about 380°–450° F. at a flow rate of 2–4 SCFH (standard cubic feet per hour). The vibrator power supply preferably biases the piezoelectric vibrator with a periodic waveform with a magnitude of about 50–300 V and a fundamental frequency (f) of about 12,000 Hz, which corresponds to:

$$f=(k \times V)/2\pi r_o$$

where:

k is a constant that varies between 0.4 and 0.8,

V is droplet velocity, and $r_o$ is orifice radius.

E.g., a 100 micron diameter orifice will require a frequency f of about 12,000 Hz, and a 25 micron diameter orifice will require about 48,000 HZ, where V is approximately 5 meters/second. Under these conditions the vibrator vibrates with an amplitude of about $4 \times 10^{-6}$ inch; the Belleville springs are selected so that they operate in a linear range for vibrations of this amplitude. For 63/37 (tin/lead) solder, the disk is formed from molybdenum, tantalum, diamond, boron nitride, or silicon carbide. In one embodiment, the disk is 0.001 inch thick and the orifice diameter is 0.004 inch. Orifice 155 of the nozzle cap is preferably 0.009–0.016 inch in diameter.

Figure 5:
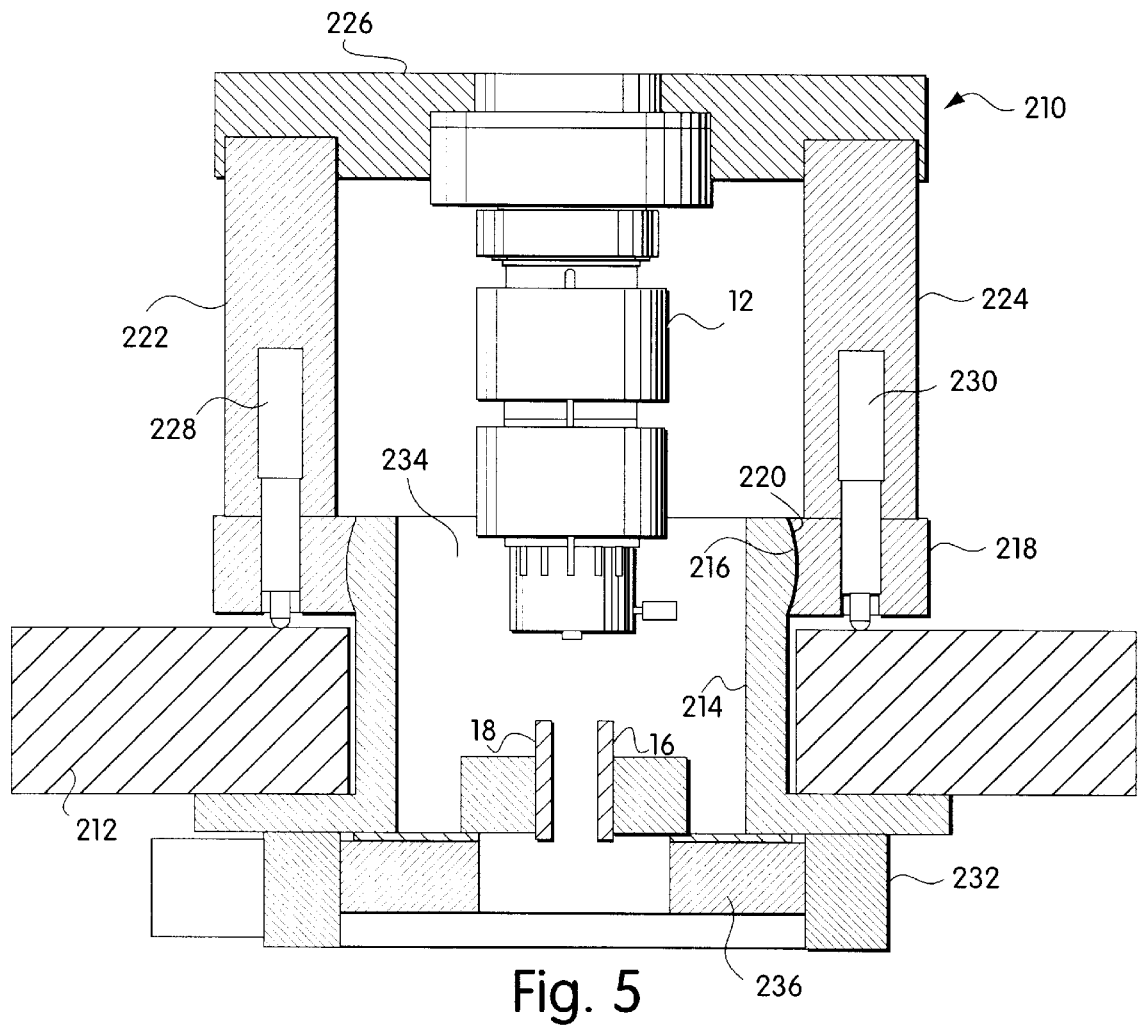
FIG. 5 is a diagrammatic side view, partially in section, of an alignment system for adjusting the orientation of a solder ejector with respect to deflection plates.

Referring to FIG. 5, the orientation of solder ejector 12 is adjusted with respect to deflection plates 16, 18 by an alignment system 210. The alignment system includes a stationary base 212, a stationary mount 214 with a hemi-spherical shaped end 216, adjustable support 218 which has a hemispherical-shaped recess 220 for receiving the shaped end of the stationary mount, support rods 222, 224, and a top ejector support 226. The center of the sphere for surfaces 216 and 220 is at the exit of the orifice of the solder ejector. Solder ejector 12 is attached to the central portion of the ejector support. Micrometers 228, 230 are used to adjust the orientation of the solder ejector with respect to the base 212 in two angular dimensions. The deflection plates are mounted to a support 232 which is connected to the base 212. In use the deflection plates swing out of the way (not shown) to allow a replaceable solder cartridge to be inserted into or removed from the solder ejector. When a solder cartridge is properly loaded, the deflection plates are then rotated into position, in alignment with the solder ejector. Base 212 and support 232 include respective throughways 234, 236 which allow solder droplets from the solder ejector to pass freely therethrough.

By this construction, the orientation of ejector 12 with respect to the deflection plates and the substrate may easily be adjusted, e.g., using feedback control provided by optical detectors 615, 617 (FIG. 1; e.g., CCD array cameras) directed toward the droplet stream trajectory. Detector 615 observes movement of the droplet stream along an axis parallel to the deflection caused by plates 16, 18, and detector 617 observes movement of the droplet stream along a perpendicular axis. The position of the solder ejector on base 212 can then be adjusted to cause a vertical stream in the absence of any deflecting charge or field. Each detector has a magnified resolution at the imaged location of the solder stream of about 5 $\mu$m, or better.

To reduce disturbances in the flow of ejected molten solder, it is desirable to use solder which has been filtered to remove particulates greater than about 0.5 $\mu$m. In addition to particulates present in the solder supply, molten solder tends to react with material and gases in the solder ejector to form particulates (e.g., in the form of lead oxide or tin oxide). Such particulates, if large enough, tend to disturb solder droplet formation or otherwise tend to collect in the ejection system. Since the solder cartridges and the attached solder-ejecting nozzles are replaceable, they may be periodically removed from the system and cleaned. This reduces particulate accumulation and thus reduces detrimental effects of such contamination.

In operation, a replaceable solder cartridge, which has been filled with pre-filtered solder that has solidified, is screwed into the solder ejector until an interference fit between the inner wall of the ejector housing and the outer walls of the solder cartridge is achieved. The heaters heat the ejector housing to a temperature above the melting point of the solder, at which point molten solder is ejected from the orifice. The piezoelectric vibrator produces a standing wave in the ejected solder stream, causing droplets to form. The orientation of the solder ejector is adjusted by micrometers 228, 230, mounted on base 212, so that the ejected solder droplets pass through the deflection plates along a preselected trajectory for which the deposition system is calibrated. The droplet stream is monitored by detectors 615, 617, and the orientation of the solder ejector is adjusted until the solder stream trajectory corresponds to the preselected trajectory.

The deflection and table motion controller causes table 52 to move along the X-axis and deflection power supply 58 to charge deflection plates 16, 18 (FIG. 1) to deflect charged droplets passing therebetween so that charged droplets are selectively deflected along the Y-axis to the desired position on the substrate or passed through to the collection gutter, based on the position of the substrate and the desired pattern of deposited solder droplets. After droplets have been deposited onto the substrate in a selected pattern, the substrate is removed from the x-y translation table. After a production run of many substrates, the pressure is removed, causing the ejection of the droplet stream from the orifice to stop.

After use, a replaceable solder cartridge is preferably cleaned and re-filled with filtered solder. Solder, e.g., 63/37 tin/lead solder, is cleaned from a replaceable cartridge using a cleaning solution of acidic acid, nitric acid, and water, mixed in equal proportions, followed by ultrasonic cleaning in alcohol, such as, isopropyl alcohol.

Figure 12:
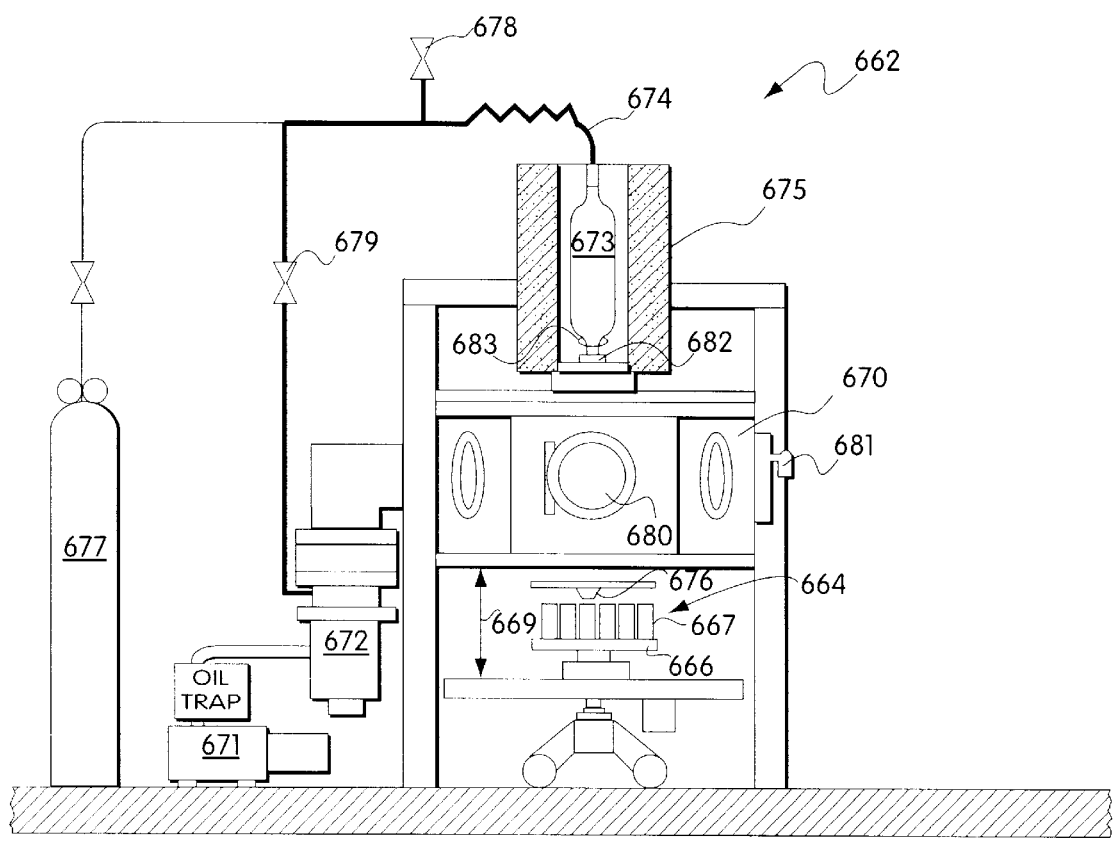
FIG. 12 is a diagrammatic side view of a contamination extractor for filling replaceable solder cartridges with solder.

As shown in FIG. 12, a contamination extractor 662 is used to fill replaceable solder cartridges 664 with filtered solder. The replaceable solder cartridges are supported on a rotatable table 666 on individual heaters 667. Table 66 is shown lower than vacuum housing 670 in FIG. 12; it can be permanently secured within housing 670 and accessed through hinged window 680. Vacuum housing 670, which is pumped down to about $10^{-4}$–$10^{-6}$ Torr or less, initially by a roughing pump 671 and finally by a turbo pump 672. A teflon-coated solder receptacle 673, loaded with solid solder via a quick connect input 674, is heated by a ceramic heater 675 to a temperature above the melting point of solder. In use, the solder cartridges are loaded into the vacuum chamber 670. A heat-shielded, teflon-coated funnel 676 directs molten solder from the solder receptacle into the solder cartridges. The molten solder is filtered through an in-line solder filter 682 before being deposited into the solder cartridges. The in-line filter is preferably formed from sintered steel or sintered ceramic, with pore sizes less than about 10 microns in diameter. (Other techniques and separators can be used to remove particulates and debris from the molten solder; e.g., a centrifuge can be used.) An inert gas supply 677 (e.g., a supply of nitrogen or other inert gas such as argon) pressurizes the upper portion of the solder receptacle, forcing the ejection of molten solder from the solder receptacle into the solder cartridges. Excess pressure is relieved by a venting valve 678. A vacuum isolation valve 679 isolates the inert gas lines from the vacuum system. The solder cartridge filling process can be monitored through an optical viewing port 680. Ion and thermocouple gauges 681 are also used to monitor the filling process. Cooling water lines 682 are disposed around the output of the solder receptacle. When all of the replaceable solder cartridges have been filled, the solder filling process is stopped by flowing room temperature (or colder) water through the cooling lines which causes the molten solder to solidify, stopping the ejection of solder from the output of the solder receptacle. Thus, the control of solder temperature by the cooling lines serves as an efficient, convenient, and clean valve. The chamber is then brought to atmospheric pressure with high-purity bottled nitrogen (less than 1 ppm oxygen). Nitrogen gas that has been boiled off from a liquid nitrogen source is then introduced into the chamber to cool the cartridges.

Other embodiments are within the scope of the claims. For example, the components of the jet soldering system that are exposed to solder during operation may be formed from chrome-plated material, Nitronic 50 (available, e.g., from Fry Steel Company, Sante Fe Springs, Calif.) or other such material that is inert to molten solder and that can withstand operating temperatures of 450° F. or greater, rather than 316 stainless steel.

Figure 6:
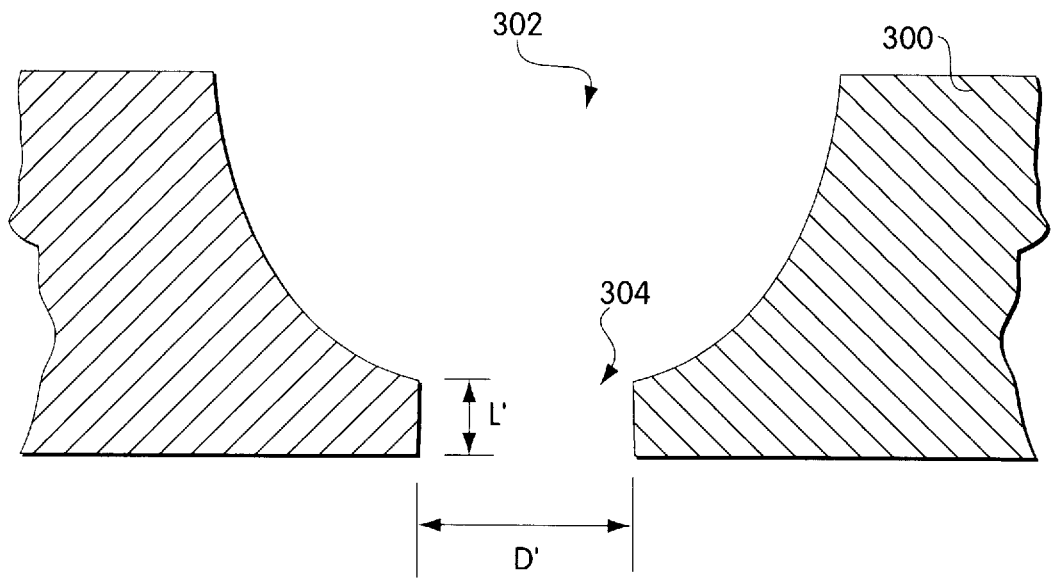
FIGS. 6 and 6A are diagrammatic side views of replaceable orifice-defining disk structures.
Figure 6A:
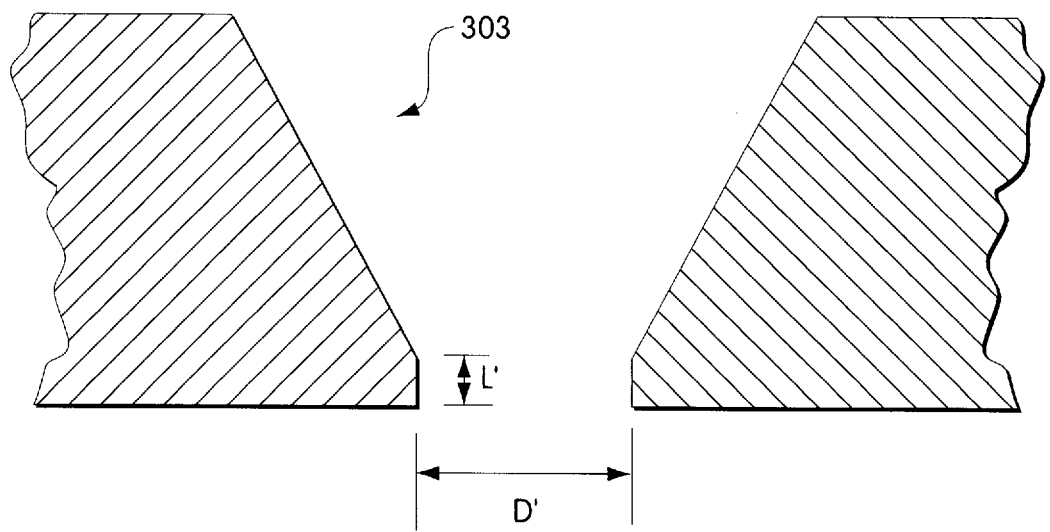

Referring to FIG. 6, in an alternative embodiment, a disk 300 is used instead of disk 158 (FIG. 3) in nozzle 140. Disk 300 includes a recess 302 with an orifice 304 defined through the disk in the center of the recess. Recess 302 is hemispherically-shaped, but other recess shapes are contemplated (e.g., a conically-shaped recess 303, as in the replaceable disk embodiment shown in FIG. 6A). As in the embodiment discussed above, orifice 304 has a diameter (D') that is sized relative to the thickness (L') of the disk at the orifice; preferably, L'/D' is at most 1.0, and more preferably is at most 0.25. These disk structures provide increased strength while maintaining a desired L'/D' ratio for good solder droplet formation.

Figure 7:
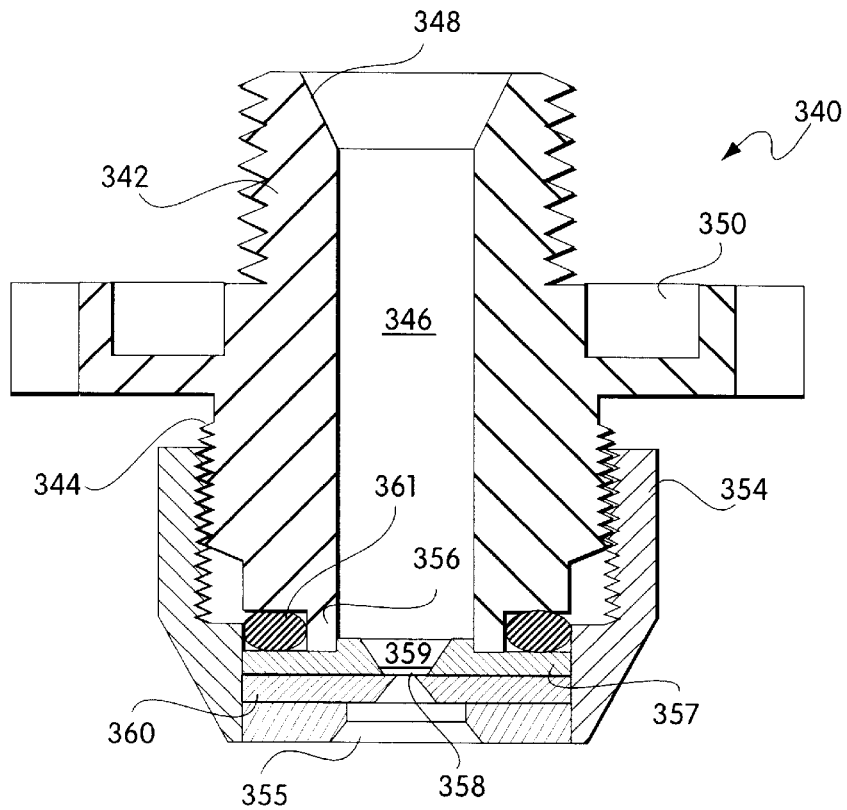
FIG. 7 is a vertical sectional view, showing an alternative replaceable nozzle device for the solder ejector.

Referring to FIG. 7, in one preferred embodiment, a nozzle 340, which couples to the bottom end of a replaceable solder cartridge, includes a base 342 with a threaded end 344 that defines cylindrical bore 346 with a conically-shaped input surface 348, which reduces flow disturbances for solder flowing between the solder cartridge and the nozzle. Base 342 includes an annular groove 350 for receiving an o-ring; the groove is sized so that the outer thickness of the o-ring is slightly larger than the depth of the groove. A nozzle cap 354 has a solder-ejecting orifice 355 and further has inner threads that engage threads at the bottom end of base 342. The base includes a cylindrical protrusion 356 onto which sits a sandwich structure that includes an upper support plate 357, a replaceable flat disk 358 that defines a liquid solder-ejecting orifice 359, and a lower support plate 360. The upper support plate has a conical orifice that tapers toward the flat disk from a relatively large diameter to a smaller diameter to reduce any disturbances in the flow of molten solder through the solder ejecting orifice of the flat disk. The lower support plate has a conical orifice that tapers toward the flat disk from a relatively large diameter to a smaller diameter to provide sufficient support to the flat disk while avoiding disturbing the stream of solder ejected from orifice 359. A sealing o-ring 361 is disposed between the sandwich structure and base 142.

So that flat disk 358 is properly supported at different operating temperatures, the thermal coefficient of linear expansion for lower support plate 360, upper support plate 357, or both, is selected to be large enough so that the amount of thermal expansion of the sandwich structure is greater than the amount of thermal expansion of cap 354. That is, the thermal coefficients of linear expansion for the upper support plate, the flat disk, and the lower support plate ($\alpha_{upper}$, $\alpha_{disk}$, $\alpha_{lower}$, respectively) are selected so that the following condition is satisfied:

$$\alpha_{upper} t_{upper} + \alpha_{disk} t_{disk} + \alpha_{lower} t_{lower} > \alpha_{cap}(t_{upper} + t_{lower} + t_{disk})$$

where $\alpha_{cap}$ is the thermal coefficient of linear expansion for cap 354, and $t_{upper}$, $t_{lower}$, and $t_{disk}$ are the thicknesses of the upper support plate, the lower support plate, and the flat disk, respectively. The upper plate typically has a thermal coefficient of linear expansion that is similar to that of the cap, and the flat disk typically has a thermal coefficient of linear expansion that is substantially less than that of the cap; therefore, the lower plate is typically selected based on the above expression to compensate for the lower thermal coefficient of linear expansion of the flat disk.

Disk 358 is 0.001 inch thick, orifice 359 is 0.004 inch in diameter, the lower plate is 0.018 inch thick and has a conical orifice with a diameter of 0.016 inch adjacent the flat disk and the upper plate is 0.018 inch thick and has a diameter of 0.032 inch adjacent the flat disk; the flat disk and the upper and lower support plates have an outer diameter that is 0.25 inch. The upper plate and the base are formed of materials that do not react with molten solder (e.g., stainless steel or Nitronic 50), the lower plate is made from a material with a thermal coefficient of linear expansion that satisfies the condition of the above expression (e.g., aluminum), and the flat disk is preferably made of molybdenum. The dimension (L) of the orifice 159 (here the thickness of the disk) is sized relative to diameter (D). L/D preferably is at most 1.0, and more preferably is at most 0.25.

Figure 7A:
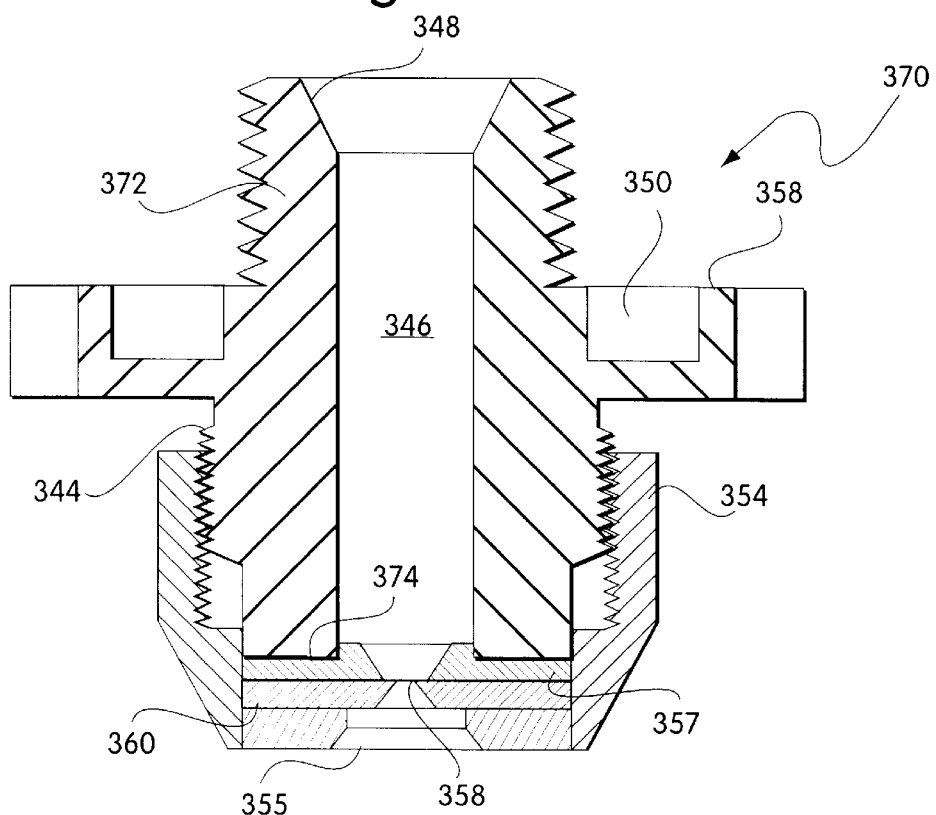
FIG. 7A is a vertical sectional view, showing another alternative replaceable nozzle device for the solder ejector.
Figure 8:
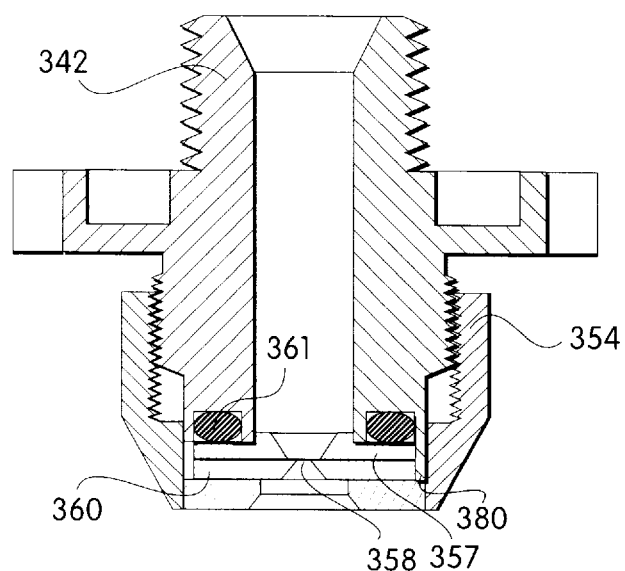
FIG. 8 is a vertical sectional view, taken at 8—8 of FIG. 8A, showing another alternative replaceable nozzle device for the solder ejector.
Figure 8A:
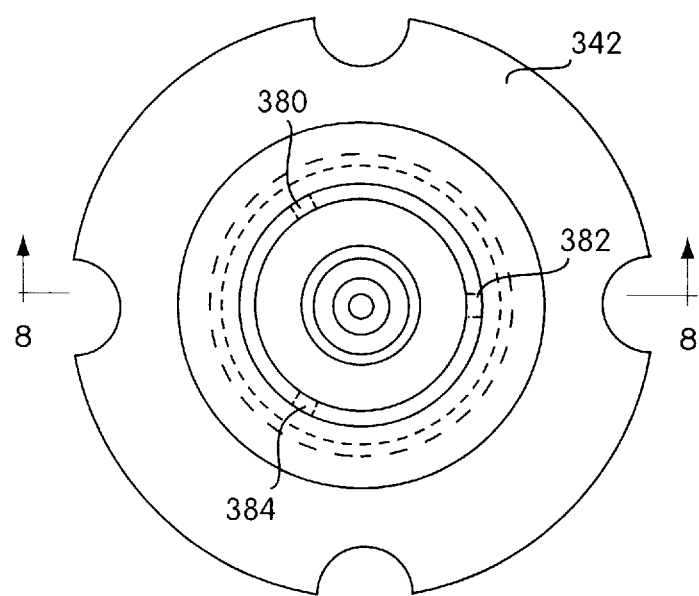
FIG. 8A is a bottom view of a base member of the FIG. 8 device.
Figure 9:
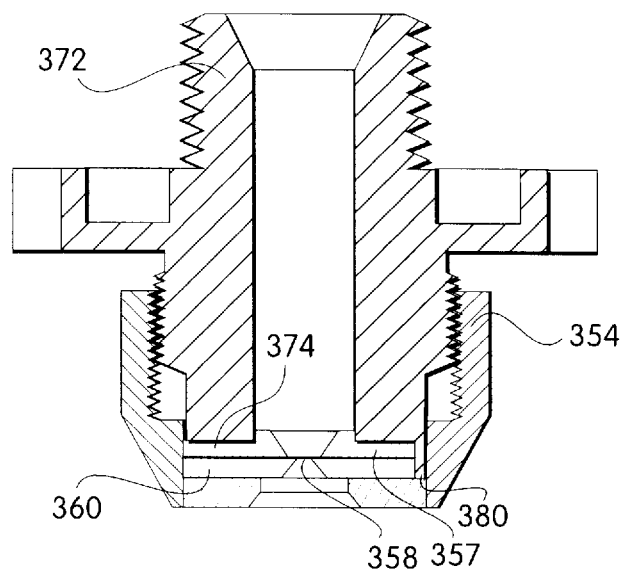
FIG. 9 is a vertical sectional view, taken at 9—9 of FIG. 9A, showing another alternative replaceable nozzle device for the solder ejector.
Figure 9A:
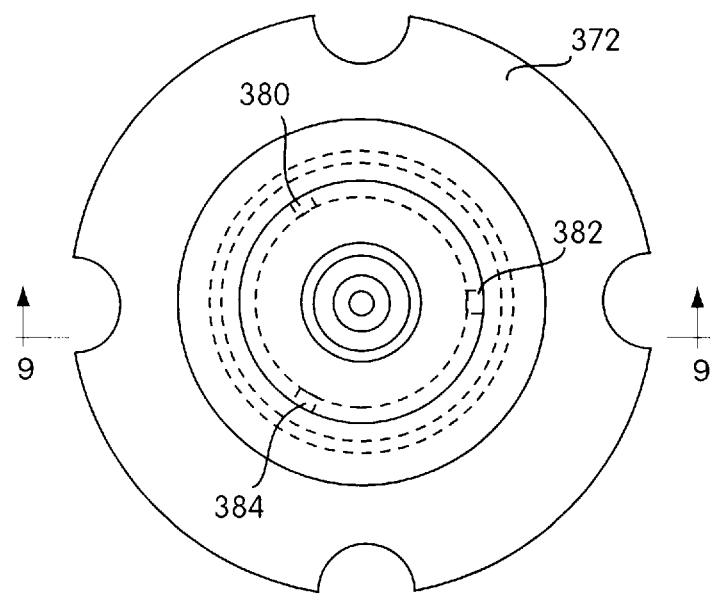
FIG. 9A is a bottom view of a base member of the FIG. 9 device.
Figure 10:
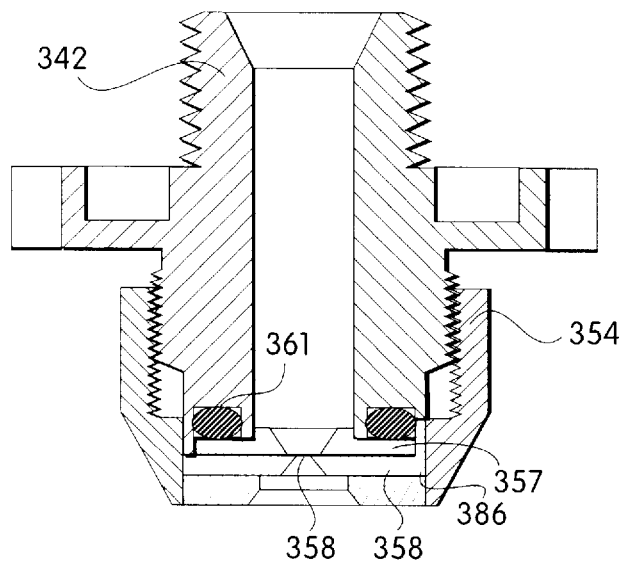
FIG. 10 is a vertical sectional view, taken at 10—10 of FIG. 10A, showing another alternative replaceable nozzle device for the solder ejector.
Figure 10A:
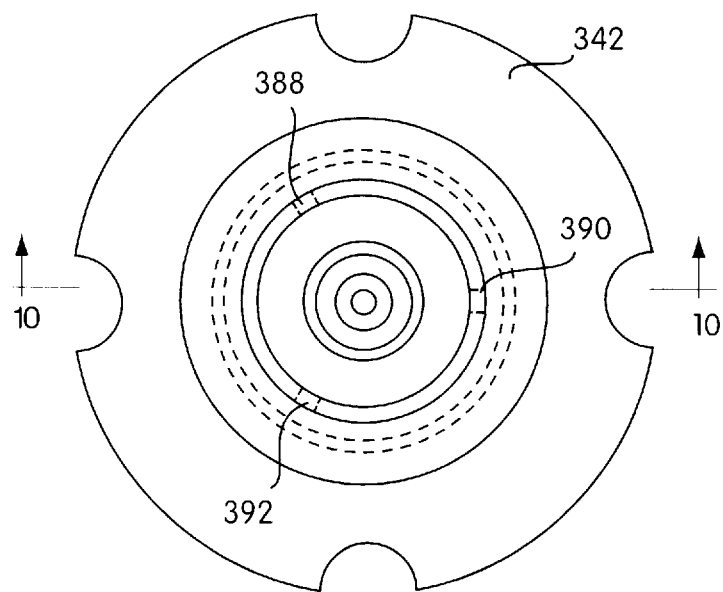
FIG. 10A is a bottom view of a base member of the FIG. 10 device.
Figure 11:
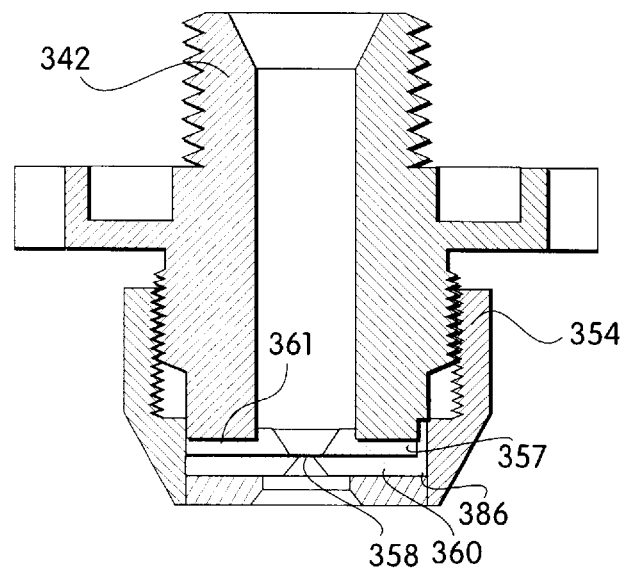
FIG. 11 is a vertical sectional view, taken at 11—11 of FIG. 11A, showing another alternative replaceable nozzle device for the solder ejector.
Figure 11A:
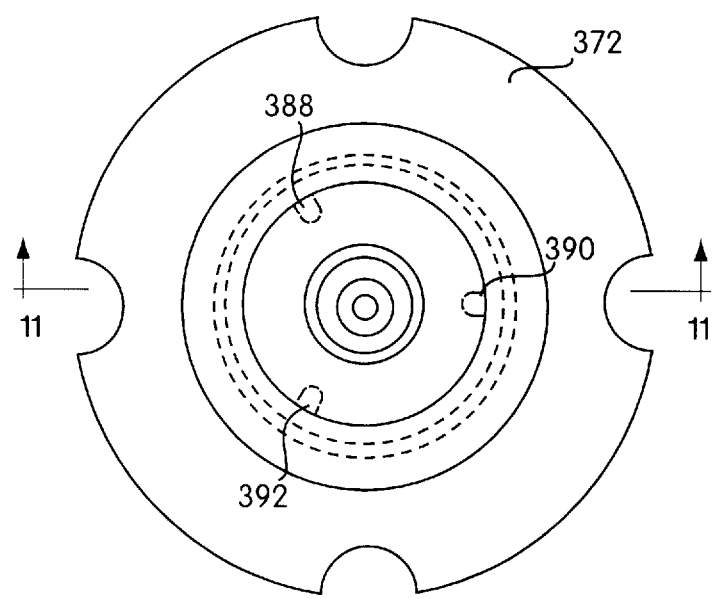
FIG. 11A is a bottom view of a base member of the FIG. 11 device.

Referring to FIG. 7A, in an alternative embodiment, rather than use o-ring 361 in FIG. 7, a nozzle 370 includes a base 372 that is constructed to form a metal-to-metal seal 374 with the upper support plate of the sandwich structure. Such a construction allows the nozzle to be used with solder that is heated to temperatures above which o-rings can be used.

The flat disks used to define the molten solder ejecting orifices are typically relatively thin, because, as the thickness of the plate increases, it becomes more difficult to form small-diameter orifices in the disk. For this reason, the orifice-defining flat disks may be subject to distortions if the nozzle cap is overly tightened, which tends to cause the cap to torque the lower plate which in turn torques the flat disk. To reduce this effect, the base can include a plurality of anti-rotation fingers 380–384 and lower plate 360, upper plate 357, and flat disk 358 can include a corresponding number of notches which are constructed to receive fingers 380–384 to prevent the lower plate from rotating, as shown in the embodiments of FIGS. 8–8A and 9–9A. Alternatively, lower support plate 360 can include a plurality of anti-rotation fingers 386 that extend toward the base, which includes a corresponding number of notches 388–392 constructed to receive fingers 386, as shown in the embodiments of FIGS. 10–10A and 11–11A.

What is claimed is:

1. An apparatus for depositing a selected pattern of solder onto a substrate on which one or more electronic components are to be mounted, the apparatus comprising a substrate support having structure for bearing a substrate on which one or more electronic components are to be mounted, a solder ejector that produces a stream of molten solder droplets along a selected trajectory relative to the substrate support to deposit molten solder onto the substrate in a selected pattern, and a gas delivery system associated with the solder ejector having an inlet for receiving pressurized inert gas and having an outlet that causes a stream of said inert gas to surround said stream of molten droplets and travel toward said substrate support with said stream, wherein the gas delivery system associated with the solder ejector includes a gas diffuser.

2. The apparatus of claim 1 wherein the gas diffuser is formed from sintered material.

3. The apparatus of claim 1 wherein the gas delivery system comprises a member defining a cylindrical gas flow passage for producing a flow of gas that surrounds ejected droplets traveling along the selected trajectory.

4. The apparatus of claim 3 wherein said member is an electrically conductive element for applying a charge to the solder droplets, and further comprising a pair of deflection elements positioned downstream of the electrically conductive element for defining an electrical field therebetween for selectively deflecting the charged solder droplets.

5. The apparatus of claim 1 wherein the gas delivery system includes a housing that is selectively detached from the solder ejector.

6. The apparatus of claim 1 wherein the gas delivery system comprises a member defining a cylindrical gas flow passage for producing a flow of gas that surrounds ejected droplets traveling along the selected trajectory, and wherein said diffuser surrounds said member and provides said gas around the circumference of said member at one end thereof.

7. The apparatus of claim 6 wherein said member is an electrically conductive element for applying a charge to the solder drops, and wherein said diffuser is made of electrically insulating material, and further comprising a pair of deflection elements positioned downstream of the electrically conductive element for defining an electrical field therebetween for selectively deflecting the charged solder droplets.

8. The apparatus of claim 1, wherein said ejector includes a replaceable solder cartridge that is detachably coupled to a housing of the solder ejector and wherein said gas delivery system is detachably coupled to said replaceable solder cartridge.

9. A method for depositing a selected pattern of solder onto a substrate on which one or more electronic components are to be mounted, the method comprising the steps of:

producing a stream of molten solder droplets along a selected trajectory relative to a substrate support bearing a substrate on which one or more electronic components are to be mounted so that molten solder droplets are deposited onto the substrate in a selected pattern; and providing a stream of inert gas that surrounds the ejected molten solder droplets and travels with them toward said substrate for substantially preventing detrimental effects of oxidizing gases on ejected solder droplets;

wherein the flow of inert gas aligned with ejected molten solder droplets is provided as a flow of pressurized gas through a gas diffuser and then through a cylindrical member that is used to charge the droplets.

10. The method of claim 9 wherein the flow of gas that is provided is nitrogen or argon gas.

11. A method for depositing a selected pattern of solder onto a substrate on which one or more electronic components are to be mounted, the method comprising the steps of:

producing a stream of molten solder droplets along a selected trajectory relative to a substrate support bearing a substrate on which one or more electronic components are to be mounted so that molten solder droplets are deposited onto the substrate in a selected pattern; and providing a stream of inert gas that surrounds the ejected molten solder droplets and travels with them toward said substrate for substantially preventing detrimental effects of oxidizing gases on ejected solder droplets;

wherein the flow of inert gas is provided by flowing pressurized gas through a sintered gas diffuser.

* * * * *